United States Patent
Zide et al.

(10) Patent No.: US 6,595,506 B1
(45) Date of Patent: Jul. 22, 2003

(54) APPARATUS AND METHOD FOR REDUCED PARTICULATE GENERATION DURING WORKPIECE HANDLING

(75) Inventors: Barry M. Zide, Medway, MA (US); Sean R. Kirkpatrick, Littleton, MA (US)

(73) Assignee: Epion Corporation, Billerica, MA (US)

( * ) Notice: Subject to any disclaimer, the term of this patent is extended or adjusted under 35 U.S.C. 154(b) by 59 days.

(21) Appl. No.: 09/715,506

(22) Filed: Nov. 17, 2000

(51) Int. Cl.[7] ................................................. B25B 11/06
(52) U.S. Cl. ...................... 269/21; 269/286; 279/128; 118/728; 451/388
(58) Field of Search ................... 269/21, 286, 903, 269/287, 296, 8; 279/3, 128, 1 M; 51/235; 361/232, 230, 233, 234; 278/1 M, 128; 118/728, 715, 723 R; 359/566

(56) References Cited

U.S. PATENT DOCUMENTS

| | | | |
|---|---|---|---|
| 5,166,856 A | | 11/1992 | Liporace et al. |
| 5,324,012 A | | 6/1994 | Aoyama et al. |
| 5,583,736 A | * | 12/1996 | Anderson ............. 361/234 |
| 5,707,409 A | * | 1/1998 | Martin ................. 51/295 |
| 5,812,362 A | | 9/1998 | Ravi |
| 5,924,917 A | * | 7/1999 | Benedict .............. 451/526 |
| 5,935,323 A | * | 8/1999 | Tanga ................... 117/79 |
| 5,989,693 A | * | 11/1999 | Yamasaki ............. 428/216 |
| 6,086,796 A | * | 7/2000 | Brown ................. 264/1.33 |
| 6,135,054 A | | 10/2000 | Inoue |
| 6,256,187 B1 | * | 7/2001 | Matsunaga et al. ..... 361/234 |
| 6,316,734 B1 | * | 11/2001 | Yang ................... 174/256 |

* cited by examiner

Primary Examiner—Joseph J. Hail, III
Assistant Examiner—Daniel Shanley
(74) Attorney, Agent, or Firm—Perkins, Smith & Cohen LLP; Jerry Cohen; Jacob N. Erlich

(57) ABSTRACT

This invention relates generally to the reduction of particulate material generation by workpiece handling components. Reduced levels of scratching, abrasion, wear and particulate generation are achieved by improved smoothing and flattening of the surface and, in a preferred embodiment, through the application of an ion beam assisted diamond-like-carbon film coating deposition.

10 Claims, 7 Drawing Sheets

US 6,595,506 B1

APPARATUS AND METHOD FOR REDUCED PARTICULATE GENERATION DURING WORKPIECE HANDLING

BACKGROUND OF THE INVENTION

This invention relates generally to the reduction of particulate material generation by workpiece handling components, and, more particularly to reduced generation of particles on workpiece handling components fabricated from metals or other materials and having a hard carbonaceous surface film.

Vacuum chucks are often used to hold and transport or otherwise handle workpieces such a semiconductor wafers, for example. Flat spatula-like holders called wafer picks are also used to transport semiconductor workpieces, with or without the benefit of vacuum assisted holding. In some other cases, electrostatic attraction is used to hold workpieces to chucks or picks for handling. When the workpieces are being chucked or unchucked or moved or transported by such chucks or picks, small relative motions between the handler (chuck or pick) and workpiece can result in abrasion or other forms of wear to either the handler surface or to the workpiece. This wear or abrasion results in the creation of particulate materials which are generally undesirable, as for example in the case of semiconductor processing, where deposition of such particles on the semiconductor wafers can result in reduced yield of the semiconductor manufacturing process. Wear and abrasion to the workpiece is also sometimes undesirable, as for example in the case of semiconductor processing, where scratches or other damage that occurs to the semiconductor workpiece surfaces can also result in reduced manufacturing yield or degraded performance of semiconductor devices.

It is has been found convenient to manufacture vacuum chucks and wafer picks from several types of metals, including for example, aluminum and various of the stainless steels. Other materials have also been used. Some prior art workpiece handlers have been made using metal chucks or picks having a softer polymer coating (fluoropolymer, for example) so as to reduce the tendency for the handler to wear or abrade the workpiece. A drawback of this approach has been that small, hard environmental particles may be transported to the polymer-coated surfaces of the handler by contaminated workpieces or by other unintentional means. Such particles may then become imbedded in the relatively soft polymer coating where they can then scratch, abrade, or otherwise wear on the workpiece surfaces. In other examples of prior art, handlers have been made of very hard materials such as certain ceramics, or hard crystalline materials like sapphire. In such cases, the hard handlers resist the imbedding of foreign particles, but must be very smooth so that the handlers themselves do not scratch or abrade the workpieces. Since it is costly to machine and smooth such hard materials, and since such materials are often brittle and thus too fragile for some types of service, they have not been economically practical in many cases. In still another example of prior art, metal vacuum chucks have been coated with hard coatings such as aluminum oxide, titanium nitride, or hard carbonaceous films sometimes referred to as diamond-like-carbon (DLC) films. It has been found that these hard film coated metal handlers have a tendency to scratch, abrade, or wear the workpieces, producing undesirable amounts of particles, and it has also been found that portions of the hard coatings tend to wear off of the vacuum chuck surfaces more quickly than desirable, resulting in increasing degrees of particle generation and thus, unsuitability for many applications.

It is therefore an object of this invention to provide a handler for contacting workpieces and having a DLC coating that has a reduced tendency to result in scratching, abrasion, or wear of the workpieces.

It is a further object of this invention to provide a handler for handling workpieces and having a DLC coating that resists being worn or otherwise separated from the handler.

It is a still further object of this invention to provide a handler for workpieces that has a reduced level of generation of particles when handling workpieces.

SUMMARY OF THE INVENTION

The objects set forth above as well as further and other objects and advantages of the present invention are achieved by the embodiments of the invention, described hereinbelow.

The present invention is a handler, which may be a vacuum chuck or a pick, for workpieces having a flat surface as is the case, for example, with most semiconductor wafers. The handler is fabricated from metal or other material so as to be of a desirable shape for holding a workpiece during manipulation, orientation, or transport. The holding function may be accomplished by gravity or vacuum assisted holding or other appropriate means including mechanical restraints or electrostatic attraction. In general the handler of the invention will have a surface for contacting a substantially flat surface on the workpiece, for example a side of a semiconductor wafer. The surface of the handler that is to contact the flat surface of the workpiece is made flat and smooth according to requirements and methods described hereinbelow and is coated with a DLC film or other hard coating, yielding an improved handler that is resistant to scratches, abrasion, and wear and that has a reduced tendency to scratch, abrade, or wear the workpiece, and that results in reduced generation of particles during the handling of the workpieces.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1A:
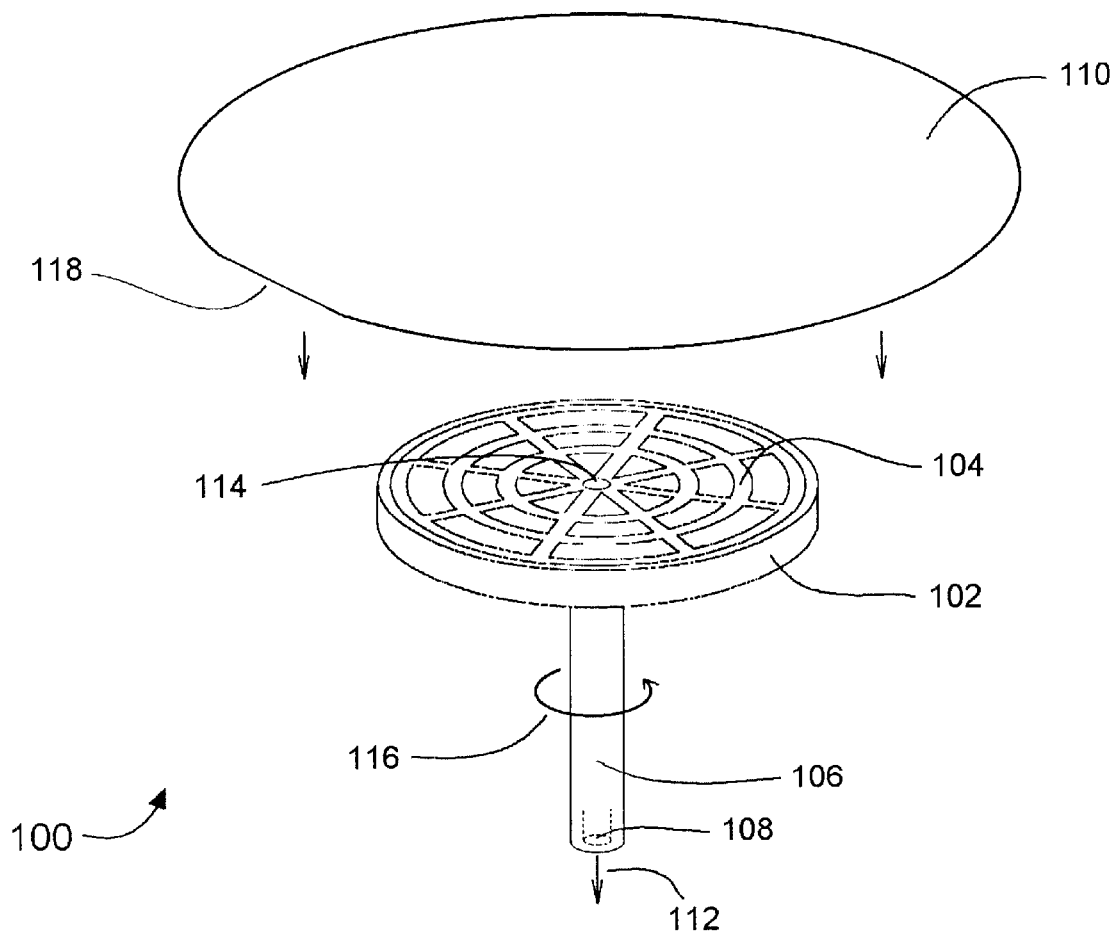
FIG. 1A is a schematic pictorial view of a prior art vacuum chuck for holding a flat workpiece such as a semiconductor wafer.

FIG. 1A shows an example of a prior art handler commonly referred to as a vacuum chuck 100. The chuck 100 is for holding a workpiece such as a semiconductor wafer 110 workpiece and for rotating it to a desired position of rotary alignment. Often the semiconductor wafer 110 has a physical feature such as a flat 118 that bears a known orientation to a crystal plane of the semiconductor. For many processes it is desirable to know the orientation of the flat 118 of the wafer 110 during the process, and a chuck 100 similar to that shown in FIG. 1A is used to hold the wafer 110 while positioning the flat 118 to a known position. The chuck 100 has a chuck head 102 that has a generally flat upper surface upon which the wafer 110 may be set. The chuck head 102 is mounted on and attached to a rotary shaft 106 that has a rotary motion 116 capability provided by drive means not shown. The chuck head has a network of circular and radial grooves 104 communicating with an evacuation hole 114 that communicates with a bore through the shaft to an opening 108 in the shaft through which air can be evacuated in the direction 112 by evacuation means not shown. Thus when the wafer 110 is placed on the chuck head 102, evacuation of air through opening 112 results in a reduced pressure in the network of grooves 104 so that wafer 110 is held in tight contact with the chuck head 102 so that rotary motion 116 can be imparted to the wafer 110 without slipping. When the wafer 110 has been repositioned as required, evacuation through opening 112 is discontinued, pressures equalize, and the wafer may be removed from the chuck for further processing.

Figure 1B:
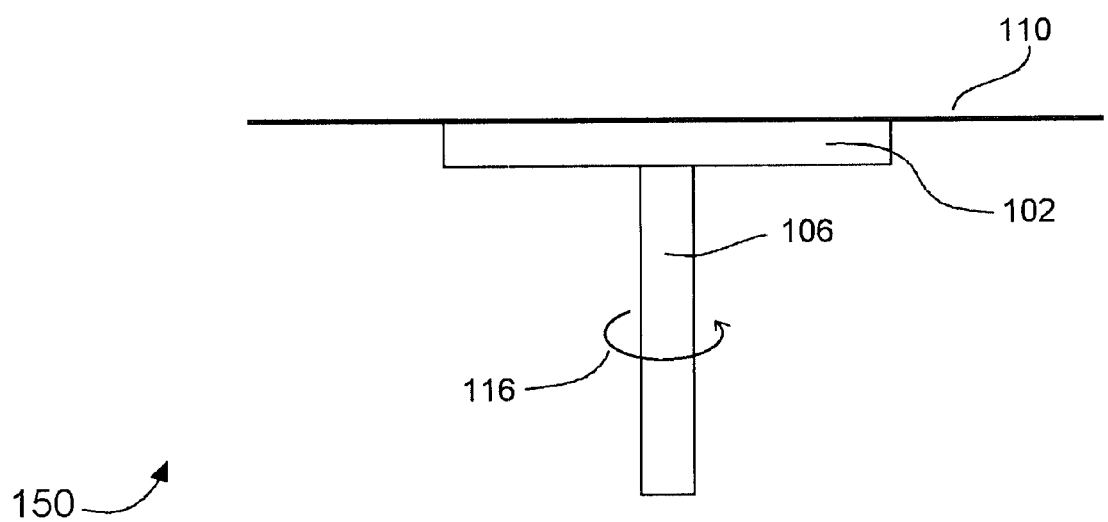
FIG. 1B is schematic side view showing the prior art vacuum chuck of FIG. 1A while holding a semiconductor wafer.

FIG. 1B shows a side view 150 wherein the wafer 110 is in contact with the chuck head 102 attached to rotary shaft 106, and undergoing rotary positioning by rotary motion 116.

Figure 2A:
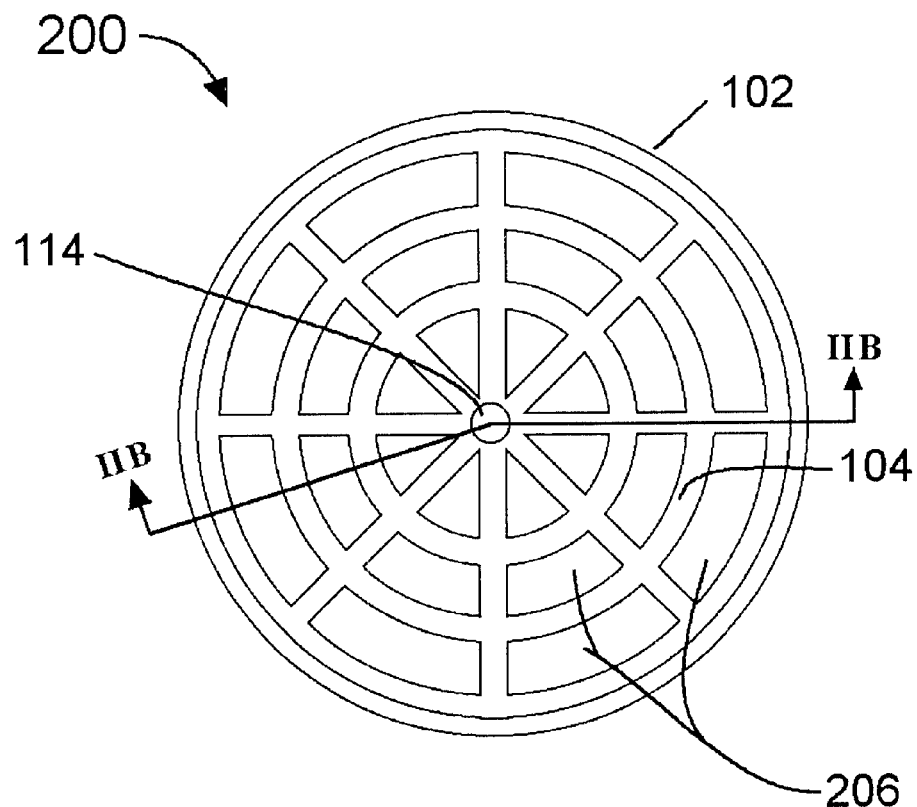
FIG. 2A shows a top view of the workpiece contacting portion of a prior art vacuum chuck.
Figure 2B:
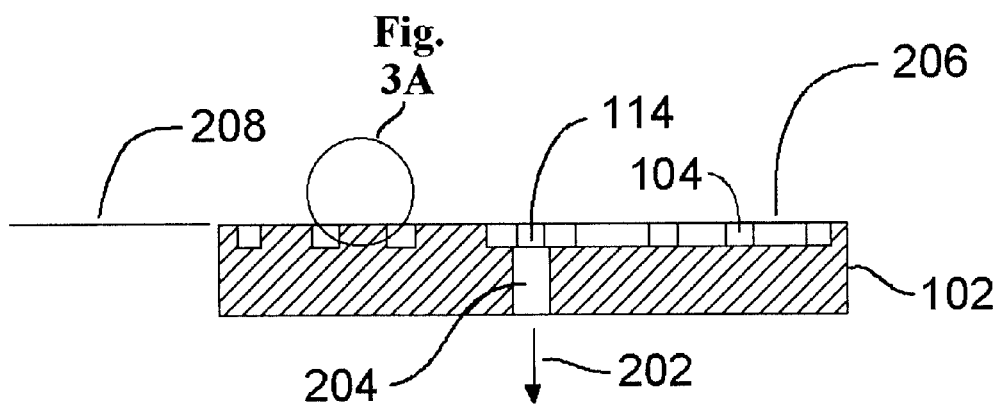
FIG. 2B is a cross sectional view taken along line IIB—IIB of FIG. 2A.

FIG. 2A shows a top view 200 of the prior art chuck head 102 of FIGS. 1A and 1B. FIG. 2B shows additional details in cross section taken along line IIB—IIB of FIG. 2A. The network of grooves 104 in the chuck head 102 communicates through hole 114 and cylindrical passageway 204 so as to permit evacuation of air in the direction 202, which would be through the rotary shaft 106 of FIGS. 1A and 1B. The network of grooves 104 defines a number of lands 206 that lie approximately in a plane 208 upon which it is intended that a flat surface of the workpiece wafer 110 (shown in FIGS. 1A and 1B) rest and be held.

Figure 2C:
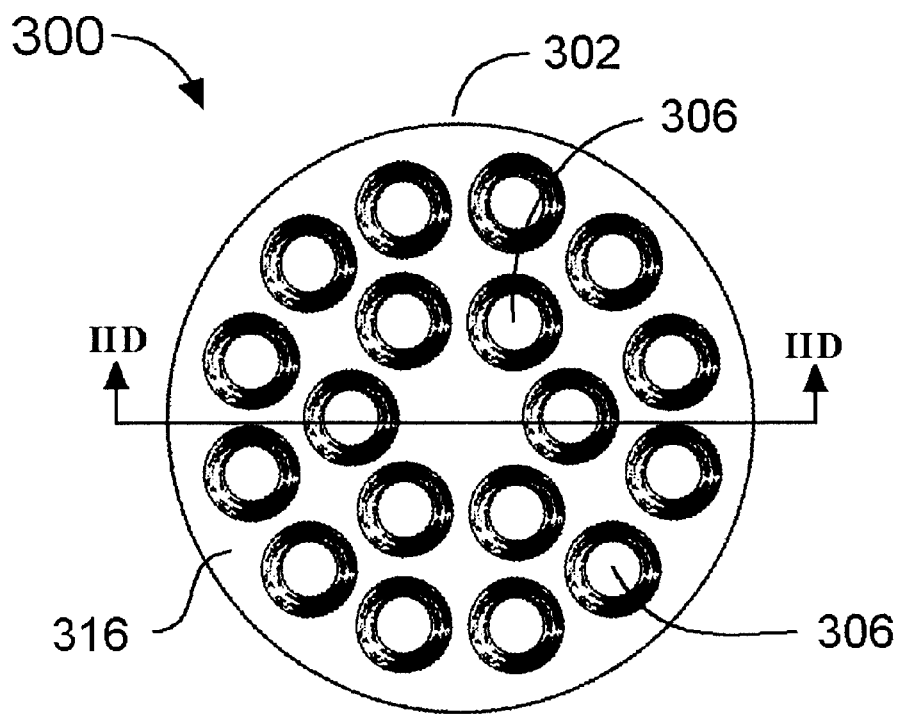
FIG. 2C shows a top view of the workpiece contacting portion of an alternate example of a prior art vacuum chuck.
Figure 2D:
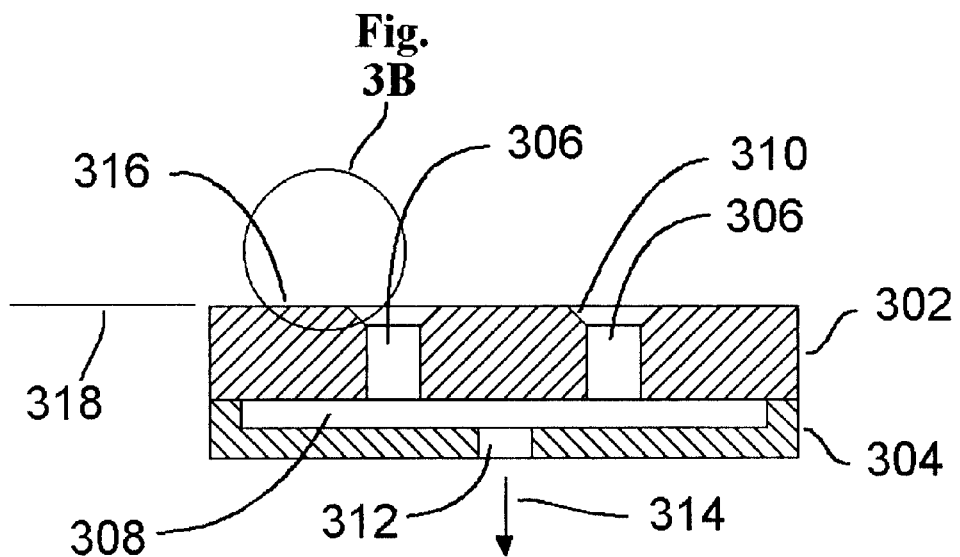
FIG. 2D is a cross sectional view taken along line IID—IID of FIG. 2C.

FIG. 2C shows a top view 300 of an alternate prior art chuck head 302. A sectional view in FIG. 2D shows additional details. The chuck head 302 is similar in function to the chuck head 102 shown in FIGS. 2A and 2B, but having a different design. Rather than the network of grooves in chuck head 102, the chuck head 302 has a number of holes 306 communicating with a manifold 308 and a cylindrical passageway 312 so as to permit evacuation of air in the direction 314. The holes 306 have chamfers 310. The manifold 308 is formed between chuck head 302 and chuck bottom 304. The top surface 316 of the chuck head 302 lies approximately in a plane 318 upon which it is intended that a flat surface of the workpiece wafer 110 (as shown in FIG. 1B) rest and be held.

Chuck heads 102 and 302 shown in FIGS. 2A and 2C, respectively, are shown as examples of prior art workpiece holders that can be improved by the present invention in a manner discussed in greater detail below. Although these examples are circular and intended for rotary positioning and utilize vacuum assisted holding, these characteristics are for example only and not for limitation. It is recognized that chucks, picks, and other workpiece holders for workpieces having a flat surface can be of many shapes including, but not limited to, round, rectangular, elongated, or irregular, and may use differing means for holding including, but not limited to, gravity, vacuum assist, electrostatic attraction assist, or mechanical clamping. The invention is applicable to all such shapes and holding means provided the intent of the holder is to hold or move a workpiece having a flat side such as, for example, a semiconductor wafer. However, these examples serve to illustrate the nature of the prior art problem that is solved by the invention.

As machined, the chuck surfaces may be on the order of 3 to 8 micro-inches average surface roughness ($R_A$). Prior to receiving a hard coating (DLC film deposition, for example) the upper surfaces have been flattened and smoothed. Some prior art methods have been:

1) To electropolish the surface to a small-scale average roughness of approximately 50 Angstroms $R_A$, or a peak-to-peak roughness, R, of a few hundred Angstroms. This results in good small-scale smoothness, but leaves poor larger-scale smoothness that results from impurity inclusions in the metal and from other reasons, and it does not improve the overall flatness of the surface.

2) To lap the surface with a diamond slurry on a hard lap to a smoothness of approximately 100 Angstroms $R_A$. This has been unsatisfactory because the hard lap tends to leave a smoothed and flat surface that has diamond particles imbedded in it and has residual scratches produced by the diamond particles of the slurry. The projecting imbedded diamond particles and the projecting portions of the scratches, producing projections in the subsequently deposited hard DLC film coating, which results in later abrading and scratching of the workpiece.

3) To polish the surface to an optical polish using a rotating pitch plate and a diamond slurry. The softer pitch plate does not imbed diamond particles in the polished surface, but the resulting dubbing rounds sharp corners and produces large-scale shallow depressions in the lands.

These prior art methods 1) and 3) result in acceptably smooth (<100 Angstroms $R_A$, and less than a few hundreds Angstroms peak-to-peak roughness, R) small-scale roughness, but poor flatness, with deviations from flatness of more than some thousands of Angstroms over distances on the order of an inch. Method 2) results in an acceptably smooth and flat surface, but with imbedded particles projecting thousands of angstroms above the surface.

Figure 3A:
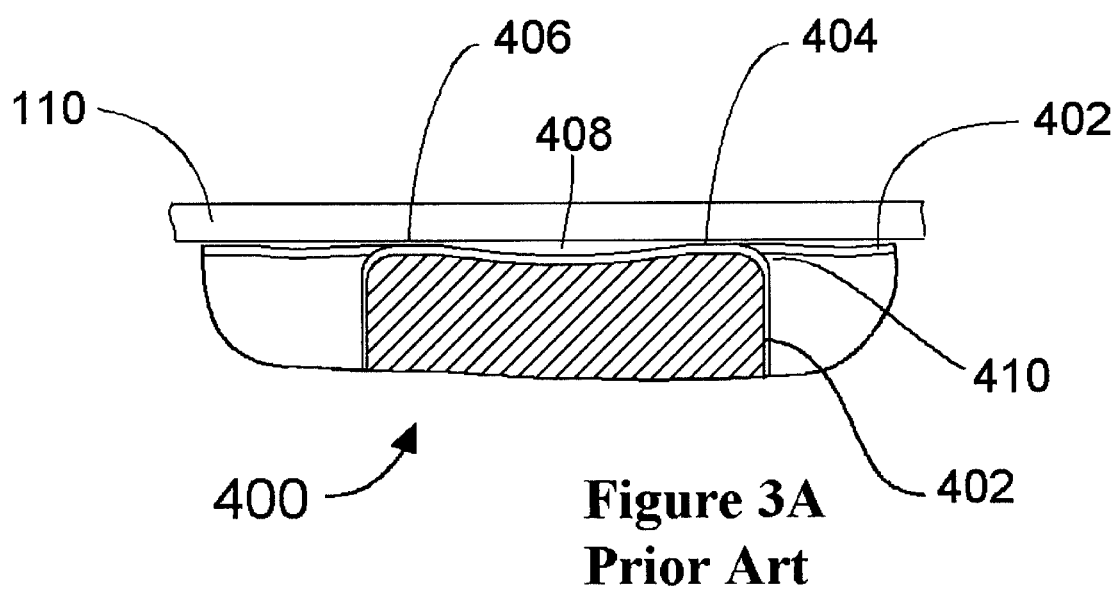
FIG. 3A represents a cross sectional detail of a portion of the prior art chuck of FIG. 2B with the workpiece in place.

FIG. 3A shows a detailed magnified cross sectional view 400 of a portion of a prior art chuck head 102 of FIG. 2B, processed according to prior art method 3 described above. The magnified view of a portion of one of the lands 206, although shown in detail, is not to scale. A DLC film coating 402 with a thickness on the order of 5000 Angstroms has been deposited on the surfaces of the lands and grooves. The corners 410 of the lands 206 show the rounding resulting from the dubbing effect of the pitch plate polishing. The central portions of the land 206 surface shows shallow depressions 408 (on the order of some thousands of Angstroms) resulting from the dubbing effect of the pitch plate polishing. This leaves a few elevated spots (404 and 406, for example) where contact between the wafer 110 workpiece and the chuck head 102 occurs. The existence of these elevated spots results in concentrated contact forces, and hence, enhanced wear at the elevated spots. This concentration results in premature wear-through of the DLC film coating in these areas, followed by degeneration of the performance of the chuck, including scratching, abrasion, wear and particle production.

Figure 3B:
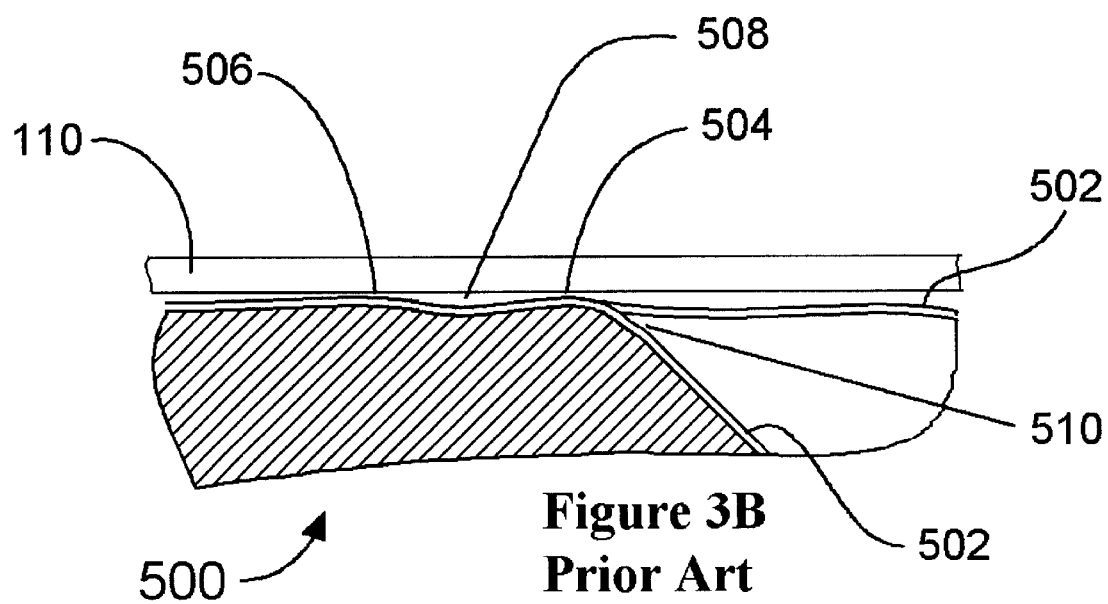
FIG. 3B represents a cross sectional detail of a portion of the prior art chuck of FIG. 2D with the workpiece in place.

FIG. 3B shows a detailed magnified view 500 of a portion of an alternative prior art chuck head 302 as shown in FIG. 2D, processed according to prior art method 3 described above. The magnified view of a portion of the top surface 316 and the chamfer 310 of one of the holes 306 is shown in detail, but is not to scale. A DLC film coating 502 having a thickness on the order of 5000 Angstroms has been deposited on the top surface 316 and the chamfer 310 of the hole 306. The corners 510 of the holes show the rounding resulting from the dubbing effect of the pitch plate polishing. Regions of the tip surface 316 show shallow depressions 508 (on the order of some thousands of Angstroms) resulting from the dubbing effects of the pitch plate polishing. This leaves a few elevated spots (504 and 506, for example) where contact between the wafer 110 workpiece and the chuck head 302 occurs. Excessive premature wear occurs at these elevated spots as in the previous example. The premature wear-through of the DLC film coating in the elevated areas is followed by degeneration of the performance of the chuck, including scratching, abrasion, wear and particle production.

In order to avoid these problems, the invention makes use of an improved process to produce a smooth handler surface with improved flatness and freedom from depressions and elevated spots. In this process, the handler surface, the surface of a chuck as illustrated, for example, in the prior art chuck shown in FIGS. 1A, 1B, 2A and 2B is first lapped (flattened) flat using a hard lap and diamond slurry to a flatness having variations significantly less than (not more than half of) the desired thickness of DLC coating that will be applied. The preferred range of thickness, T, of the DLC coating to be applied is from approximately 2000 Angstroms thick to approximately 10,000 Angstroms thick. For example, for a DLC film coating of desired 5000 Angstrom thickness, T, the lapping of the handler surface should be to an overall flatness, F, of 2500 Angstroms or better (F less than or equal to T/2), with smaller values of F being preferred.

Figure 4:
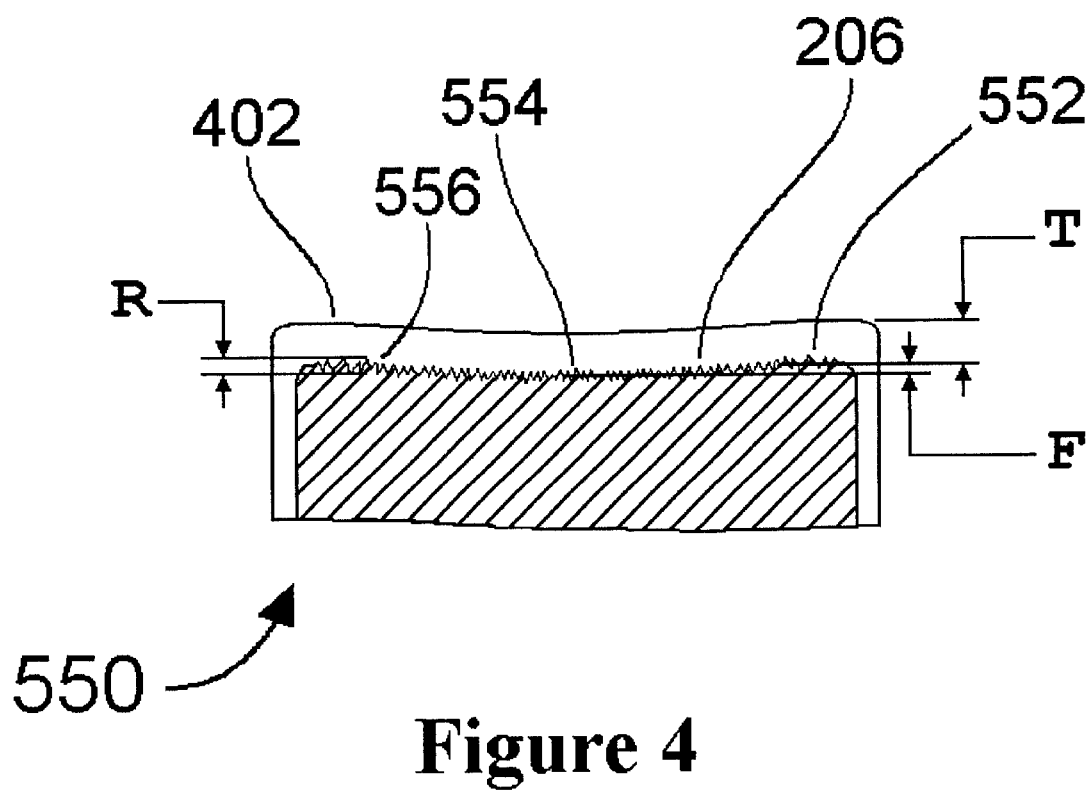
FIG. 4 shows, schematically, in cross section the relationship between the flatness and roughness of the handler surface and the thickness of the hard coating used with the present invention.

FIG. 4 shows (not to scale) a detail 550 of a portion of a handler surface 206, including the relationship of peak-to-peak roughness, R, and the flatness, F, of the handler surface to the thickness, T, of a DLC film coating, 402, thereon. As shown in FIG. 4, in this invention, flatness, F, means maximum deviation between the high points, 552, and the low points, 554, of the handler surface, and the peak-to-peak roughness, R, means the maximum deviation between the high and low points of the small scale roughness 556 of the surface. The lapping of the handler surface also produces handler surface average roughness, $R_A$, on the order of 100 Angstroms, but with an undesirably large peak-to-peak roughness typically more-than 1000 Angstroms due to scratches and imbedded bits of diamond lapping abrasive. The lapping process has proven to be capable to achieve overall flatness on the order of one wavelength of helium light (approximately 600 Angstroms) as measured by conventional fringe techniques.

Following the lapping, additional smoothing takes place by way of a short optical polish using, for example, but not limited thereto, a rotating pitch plate with diamond slurry to remove scratches and diamond particles imbedded by the lap. The polish is short (typically on the order of 2 minutes with conventional equipment) so as to avoid significant dubbing, such that any dubbing produces depressions and elevated spots that deviate considerably less than the desired DLC film coating thickness. The polish produces an average roughness, $R_A$, of less than 100 Angstroms, preferably on the order of 50 Angstroms or less, and having a peak-to-peak roughness of 600 Angstroms or less, preferably on the order of 300 Angstroms or less. It has proven to be practical to limit the dubbing effects to the order of one wavelength of Helium light, while providing the necessary polish (R less than or equal to 600 Angstroms).

Following the polishing, the surfaces to be coated are cleaned by conventional methods and DLC film of the desired thickness, T, for example, on the order of 5000 Angstroms is applied. For best results, the substrate flatness, F, plus the substrate roughness, R, should not exceed three quarters of the value of the thickness, T, of the desired hard film coating for the handler surface.

A variety of hard coatings can be applied to the handler substrate, such as aluminum oxide, titanium nitride, or hard carbonaceous films sometimes referred to as diamond-like-carbon (DLC) films. In the preferred embodiment of the invention, a DLC film is applied after flattening and smoothing of the substrate.

Although a variety of conventional methods can be used to apply the DLC film to the prepared handler surface, in a preferred method of this invention, an approximately 5000 Angstrom thick DLC film is deposited by conventional argon ion beam assisted vapor deposition of silicone oil vapor, from a silicone-oil precursor, such as DC—702 diffusion pump fluid, manufactured and supplied by Dow Corning Corporation. This results in a smooth durable wear resistant surface that has low internal stresses with strong adherence to metal and ceramic substrates.

Figure 5:
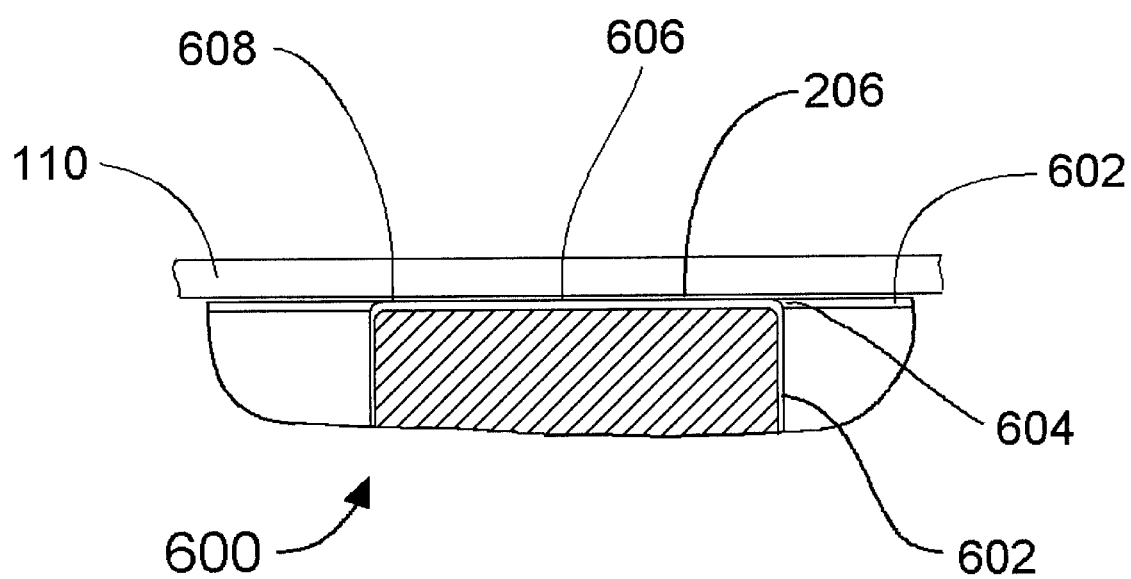
FIG. 5 represents a cross sectional detail of a portion of a chuck of this invention having a form similar to that of the prior art chuck shown in FIG. 3A, and as made with the process of the invention.

FIG. 5 shows a cross section of a chuck head 600 similar to the prior art chuck head 102 shown in FIGS. 1A, 1B, 2A and 2B clearly illustrating the benefits of the improvements of the invention. A magnified view of a portion of one of the lands 206 is shown in detail, but is not to scale. A DLC film coating 602 with a preferred thickness on the order of 5000 Angstroms has been deposited by conventional argon ion beam assisted vapor deposition of silicone oil vapor from a silicone oil precursor. Compared to the prior art (in FIG. 3A) there is considerably less rounding of the corner 604 and that the deviation between elevated spot 608 and shallow depression 606 is greatly reduced and considerably less than the 5000 Angstrom thickness of the DLC film coating. Consequently forces between the wafer 110 workpiece and the chuck head 102 having the improvements of the invention are distributed much more uniformly over the total surface areas of all the lands 206. Since there is not concentration of forces, any wear occurs uniformly over the surface of the holder with a consequent long service lifetime. The smoothness of the hard surface results in a lowered level of scratching, abrasion, wear and particulate generation.

Although the invention has been described with respect to various embodiments, it should be realized this invention is also capable of a wide variety of further and other embodiments within the spirit and scope of the appended claims.

What is claimed is:

1. A workpiece holder for handling a workpiece, comprising:
   a flat surface formed on a portion of said holder for contacting the workpiece;

said flat surface portion comprising a hard coating of a thickness, T;

a second flat surface located immediately underneath said hard coating and having a flatness less than or equal to T/2; and said second flat surface having a peak to peak roughness, R, of less than approximately 600 Angstroms, wherein said flatness, said roughness and said hard coating are adapted to minimize particulate material generation from workpiece handling while a workpiece is handled by said holder.

2. The workpiece holder of claim 1 wherein said hard coating is a DLC film coating.

3. The workpiece holder of claim 1 wherein said hard coating is a hard carbonaceous coating.

4. The workpiece holder of claim 1 wherein said hard coating is a titanium nitride coating.

5. The workpiece holder of claim 1 wherein said hard coating is an anodized aluminum coating.

6. The workpiece holder of claim 1 wherein said workpiece holder is of a material type comprising a metal, or a ceramic, or a single crystalline material.

7. The workpiece holder of claim 1 wherein thickness, T, is in the range from approximately 2000 Angstroms to approximately 10,000 Angstroms.

8. The workpiece holder of claim 1 capable of handling workpieces being semiconductor wafers.

9. The workpiece holder of claim 1, wherein said workpiece holder is a wafer chuck.

10. The workpiece holder of claim 1, wherein said workpiece holder is a wafer pick.

* * * * *